United States Patent
Xu et al.

(10) Patent No.: US 7,964,442 B2
(45) Date of Patent: Jun. 21, 2011

(54) METHODS TO OBTAIN LOW K DIELECTRIC BARRIER WITH SUPERIOR ETCH RESISTIVITY

(75) Inventors: Huiwen Xu, Sunnyvale, CA (US); Yijun Liu, San Jose, CA (US); Li-Qun Xia, Santa Clara, CA (US); Derek R. Witty, Fremont, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 698 days.

(21) Appl. No.: 11/869,416

(22) Filed: Oct. 9, 2007

(65) Prior Publication Data

US 2009/0093132 A1    Apr. 9, 2009

(51) Int. Cl.
*H01L 51/40* (2006.01)

(52) U.S. Cl. ..... 438/99; 438/790; 257/40; 257/E21.277; 427/488; 427/489; 427/503; 427/515

(58) Field of Classification Search ..... 438/99, 438/780; 257/40, E21.24, E21.277; 427/488, 427/489, 491, 503, 515
See application file for complete search history.

(56) References Cited

U.S. PATENT DOCUMENTS

| 6,147,009 | A | 11/2000 | Grill et al. | |
|---|---|---|---|---|
| 6,541,367 | B1 | 4/2003 | Mandal | |
| 6,596,627 | B2 | 7/2003 | Mandal | |
| 6,838,393 | B2 * | 1/2005 | Yim et al. | 438/769 |
| 6,974,766 | B1 | 12/2005 | Huang | |
| 7,326,444 | B1 * | 2/2008 | Wu et al. | 427/579 |
| 7,470,611 | B2 | 12/2008 | Huang | |
| 7,670,945 | B2 | 3/2010 | Huang | |
| 2004/0152334 | A1 | 8/2004 | Ohto et al. | |
| 2009/0305514 | A1 * | 12/2009 | Schmitt et al. | 438/763 |

FOREIGN PATENT DOCUMENTS

| CN | 1518075 | 8/2004 |
|---|---|---|
| KR | 10-2001-0085677 | 9/2001 |

OTHER PUBLICATIONS

Notice of First Office Action dated Jan. 29, 2010 for Chinese Patent Application No. 200810169676.8.
Notice to File a Response dated Aug. 18, 2010 for Korean Patent Application No. 2008-0099233.

* cited by examiner

*Primary Examiner* — Matthew C Landau
*Assistant Examiner* — Colleen E Snow
(74) *Attorney, Agent, or Firm* — Patterson & Sheridan, L.L.P.

(57) ABSTRACT

The present invention generally provides a method for forming a dielectric barrier with lowered dielectric constant, improved etching resistivity and good barrier property. One embodiment provides a method for processing a semiconductor substrate comprising flowing a precursor to a processing chamber, wherein the precursor comprises silicon-carbon bonds and carbon-carbon bonds, and generating a low density plasma of the precursor in the processing chamber to form a dielectric barrier film having carbon-carbon bonds on the semiconductor substrate, wherein the at least a portion of carbon-carbon bonds in the precursor is preserved in the low density plasma and incorporated in the dielectric barrier film.

3 Claims, 5 Drawing Sheets

METHODS TO OBTAIN LOW K DIELECTRIC BARRIER WITH SUPERIOR ETCH RESISTIVITY

BACKGROUND OF THE INVENTION

1. Field of the Invention

Embodiments of the present invention generally relate to the fabrication of integrated circuits. More particularly, embodiments of the present invention relate to methods for forming a dielectric barrier film used in manufacturing semiconductor devices.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.1 μm feature sizes, and tomorrow's facilities soon will be producing devices having even smaller feature sizes.

The continued reduction in device geometries has generated a demand for films having low dielectric constant (k) values because the capacitive coupling between adjacent metal lines must be reduced to further reduce the size of devices on integrated circuits. In particular, insulators having dielectric constants, less than about 3.0, are desirable. Examples of insulators having low dielectric constants include spin-on glass, porous film, carbon-doped silicon oxide, and polytetrafluoroethylene (PTFE), which are all commercially available.

However, low k dielectric materials are often susceptible to interlayer diffusion of conductive materials, such as copper, which can result in the formation of short circuits and device failure. A dielectric barrier/liner material is often disposed between metal structure and surrounding low k dielectric materials to prevent interlayer diffusion of metal and byproducts. However, traditional dielectric barrier materials, such as silicon nitride, often have high dielectric constants of 7 or higher. The combination of such a high k dielectric material with surrounding low k dielectric materials results in dielectric stacks having a higher than desired dielectric constant.

Porosity has been introduced to barrier layers, for example by adding methyl g compounds or oxygen doping, to reduce dielectric constant. However, conventional approaches for introducing porosity to barrier layers usually result in loss in etch selectivity and barrier property.

Therefore, there is a need for a method for generating a low k dielectric barrier layers without sacrificing barrier performance and etching resistance.

SUMMARY OF THE INVENTION

The present invention generally provides a method for forming a dielectric barrier with lowered dielectric constant, improved etching resistivity and good barrier performance.

One embodiment provides a method for processing a semiconductor substrate comprising flowing a precursor to a processing chamber, wherein the precursor comprises silicon-carbon bonds and carbon-carbon bonds, and generating a low density plasma of the precursor in the processing chamber to form a dielectric barrier film having carbon-carbon bonds on the semiconductor substrate, wherein the at least a portion of carbon-carbon bonds in the precursor is preserved in the low density plasma and incorporated in the dielectric barrier film.

Another embodiment provides a method for processing a semiconductor substrate comprising forming trenches in a first dielectric layer, wherein the trenches are configured to retain conductive materials therein, lining the trenches with a conformal dielectric barrier film, lining the trenches with a metallic barrier film on the conformal dielectric barrier film, depositing a conductive material on the metallic barrier film to fill the trenches, planarizing the conductive material to expose the first dielectric layer, depositing a porous dielectric barrier layer over the conductive material and the first dielectric layer, wherein the porous dielectric barrier layer comprises carbon-carbon bonds and silicon-carbon bonds, and the porous dielectric barrier layer has a substantially higher wet etching resistivity than the first dielectric layer, and forming air gaps between the trenches by contracting the first dielectric layer with a wet etching solution through the porous dielectric barrier layer, wherein the conformal dielectric barrier film serves as a barrier and etch stop against the wet etching solution.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally provide a method for forming a barrier with lowered dielectric constant, improved etching resistivity and good barrier property. Embodiments of the present invention comprise forming a silicon carbide based barrier layer comprising silicon-carbon and carbon-carbon bonds, such as single carbon-carbon bonds (C—C), double carbon-carbon bonds (C=C), triple carbon-carbon bonds (C≡C), or combinations thereof. Dielectric constant of the barrier film of the present invention is decreased by the presence of carbon-carbon bonds, which reduce polarization. Barrier films of the present invention generally have a dielectric constant of less than or equal to 4.0. At the same time, etching resistivity of the barrier film increases due to increased carbon concentration. Barrier performance, for example barrier against copper diffusion, is increased because the density is maintained and carbon concentration is maintained.

A barrier of the present invention may be generated using plasma enhanced chemical vapor deposition (PECVD). A precursor comprising one or more compounds that provide silicon-carbon bonds and carbon-carbon bonds may be flown into a PECVD chamber. A radio frequency (RF) power is applied to the precursor to generate a low density plasma in the PECVD chamber. The RF power is controlled such that at least a portion of carbon-carbon bonds in the precursor are preserved and incorporated into a substrate positioned in the PECVD chamber. The application of low plasma density is also used to generate porosity when porosity is desired.

Chamber for Generating the Barrier

Embodiments of the present invention may be performed in a PECVD chamber, for example, a PRODUCER® SE CVD system or a DXZ® CVD system, both commercially available from Applied Materials, Inc., Santa Clara, Calif.

Figure 1:
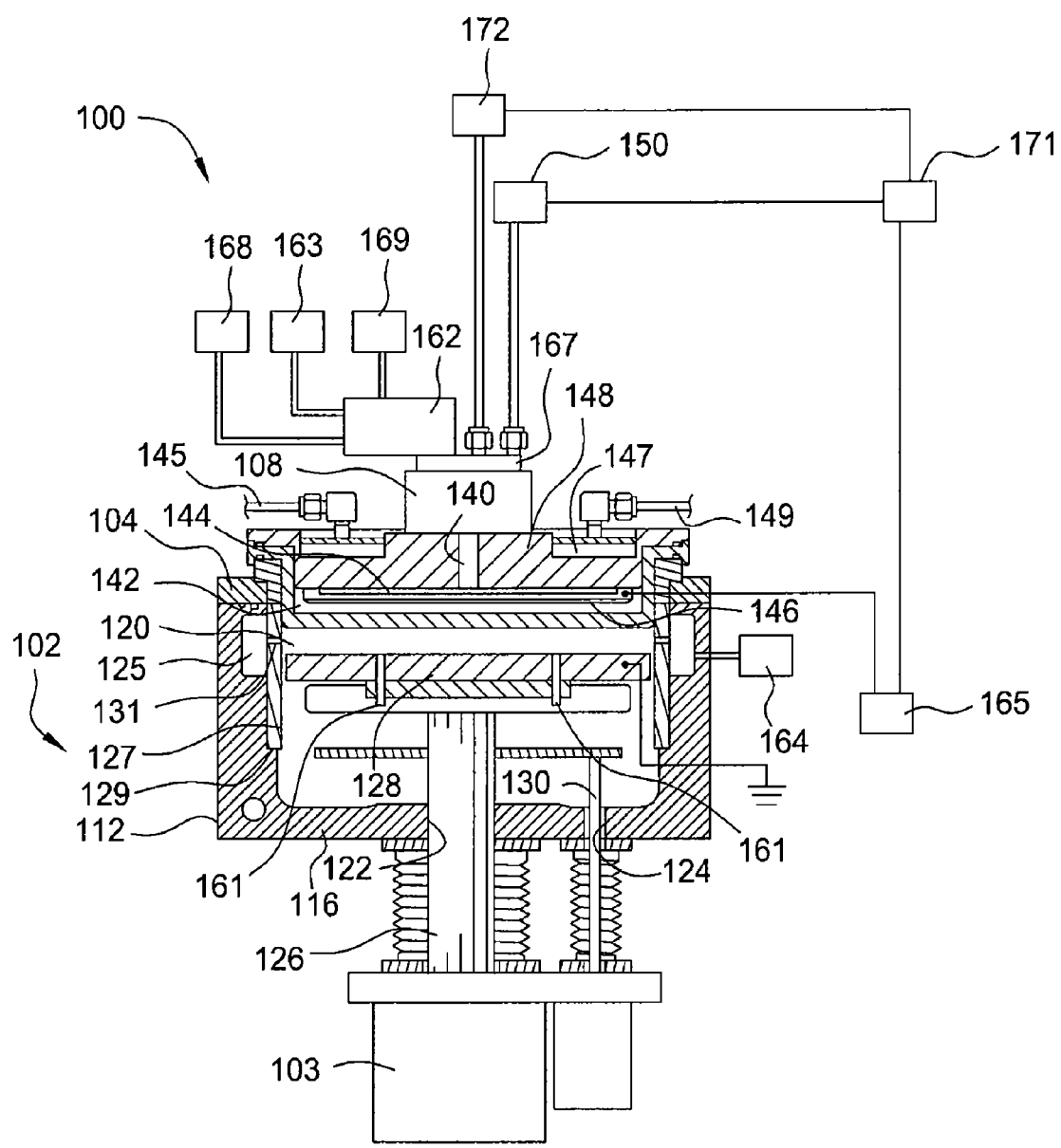
FIG. 1 schematically illustrates a sectional side view of an exemplary processing chamber configured for depositing a dielectric film in according to embodiments of the present invention.

FIG. 1 schematically illustrates a sectional side view of an exemplary PECVD system 100 configured for use according to embodiments of the present invention.

The PECVD system 100 generally comprises a chamber body 102 supporting a chamber lid 104 which may be attached to the chamber body 102 by a hinge. The chamber body 102 comprises sidewalls 112 and a bottom wall 116 defining a processing region 120. The chamber lid 104 may comprise one or more gas distribution systems 108 disposed therethrough for delivering reactant and cleaning gases into the processing region 120. A circumferential pumping channel 125 formed in the sidewalls 112 and coupled to a pumping system 164 is configured for exhausting gases from the processing region 120 and controlling the pressure within the processing region 120. Two passages 122 and 124 are formed in the bottom wall 116. A stem 126 of a heater pedestal 128 for supporting and heating a substrate being processed passes through the passage 122. A rod 130 configured to activate substrate lift pins 161 passes through the passage 124.

The heater pedestal 128 is movably disposed in the processing region 120 driven by a drive system 103 coupled to the stem 126. The heater pedestal 128 may comprise heating elements, for example resistive elements, to heat a substrate positioned thereon to a desired process temperature. Alternatively, the heater pedestal 128 may be heated by an outside heating element such as a lamp assembly. The drive system 103 may include linear actuators, or a motor and reduction gearing assembly, to lower or raise the heater pedestal 128 within the processing region 120.

A chamber liner 127, preferably made of ceramic or the like, is disposed in the processing region 120 to protect the sidewalls 112 from the corrosive processing environment. The chamber liner 127 may be supported by a ledge 129 formed in the sidewalls 112. A plurality of exhaust ports 131 may be formed on the chamber liner 127. The plurality of exhaust ports 131 is configured to connect the processing region 120 to the pumping channel 125.

The gas distribution system 108 configured to deliver reactant and cleaning gases is disposed through the chamber lid 104 to deliver gases into the processing region 120. The gas distribution system 108 includes a gas inlet passage 140 which delivers gas into a shower head assembly 142. The showerhead assembly 142 is comprised of an annular base plate 148 having a blocker plate 144 disposed intermediate to a faceplate 146. An RF (radio frequency) source 165 coupled to the shower head assembly 142 provides a bias potential to the showerhead assembly 142 to facilitate generation of a plasma between the faceplate 146 of the showerhead assembly 142 and the heater pedestal 128. The RF source 165 generally comprises a high frequency radio frequency (HFRF) power source, e.g., a 13.56 MHz RF generator, and a low frequency radio frequency (LFRF) power source, e.g., a 300 kHz RF generator. The LFRF power source provides both low frequency generation and fixed match elements. The HFRF power source is designed for use with a fixed match and regulates the power delivered to the load, eliminating concerns about forward and reflected power.

A cooling channel 147 is formed in the base plate 148 of the gas distribution system 108 to cool the base plate 148 during operation. A cooling inlet 145 delivers a coolant fluid, such as water or the like, into the cooling channel 147. The coolant fluid exits the cooling channel 147 through a coolant outlet 149.

The chamber lid 104 further comprises matching passages to deliver gases from one or more gas sources 172 and a remote plasma source 162 to a gas inlet manifold 167 positioned on top of the chamber lid 104.

The remote plasma source 162 is generally connected to a precursor source 163, a carrier gas source 168 and a power source 169. A carrier gas, such as argon, nitrogen, helium, hydrogen or oxygen, etc, may be flown to the remote plasma source 162 and to the processing region 120 to aid the transportation of the activated species and/or to assist in the cleaning process, or help initiating and/or stabilizing the plasma in the processing region 120.

One or more processing gases may be delivered to the processing region 120 via the gas inlet manifold 167. A PECVD system generally comprises one or more precursor delivery systems. The PECVD system 100 may comprises one or more liquid delivery gas source 150 and one or more gas sources 172 configured to provide a carrier gas and/or a precursor gas.

The PECVD system 100 further comprises a system controller 171 configured to adjust operation parameters. In one embodiment, the system controller 171 may be configured to adjust the one or more liquid delivery gas source 150, the one or more gas source 172, and the RF source 165.

The PECVD system 100 may be configured to deposit a variety of films on the substrate depending on process recipes used. More detailed description of similar PECVD systems may be found in U.S. Pat. No. 5,855,681, No. 6,495,233, and No. 6,364,954, which are incorporated herein by reference.

Process for Generating the Barrier

Figure 2:
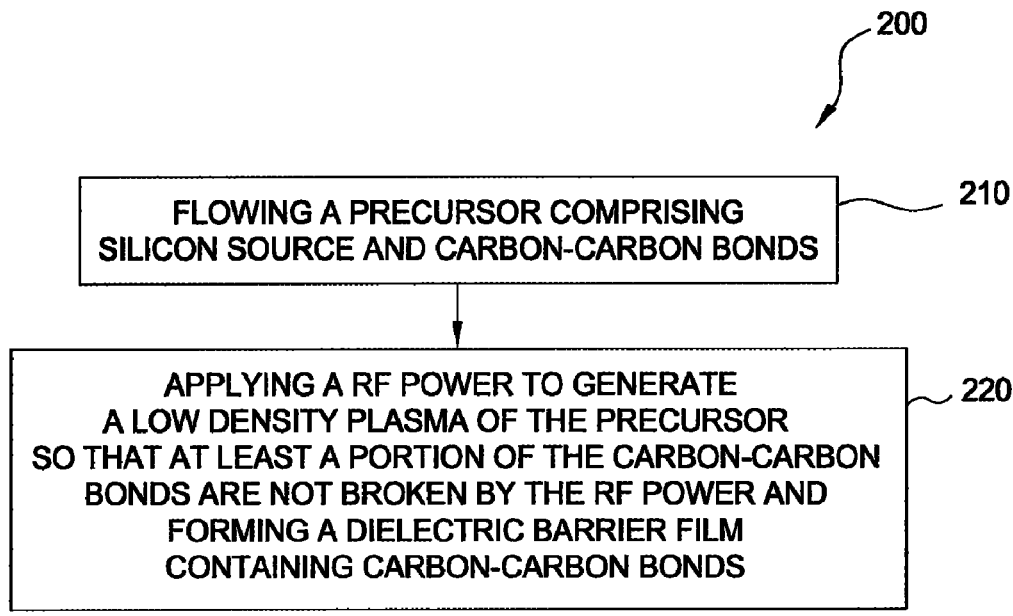
FIG. 2 is a flow chart illustrating a process sequence in accordance with one embodiment of the present invention.

FIG. 2 is a flow chart illustrating a process sequence 200 in accordance with one embodiment of the present invention.

In step 210, a precursor is flown into a processing chamber, generally after positioning a substrate in the cleaned and purged processing chamber. The precursor comprises one or more compounds that provide silicon-carbon bonds and carbon-carbon bonds including single carbon-carbon bonds (C—C), double carbon-carbon bonds (C=C), triple carbon-carbon bonds (C≡C), or combinations thereof.

In step 220, an electromagnetic power, such as a RF power, is applied and a low density plasma of the precursor is generated in the processing chamber. The RF power is configured to cause low bombardment that enables reaction of species in the precursor and preserves at least a portion of the carbon-carbon bonds. As a result, a carbon-carbon bond containing barrier film is formed on the substrate being processed. In one embodiment, the low density plasma may be tuned by controlling the power level of the RF source for generating plasma and/or controlling the chamber pressure. In one embodiment, power level and/or chamber pressure may be tuned to control ratio of carbon-carbon bonds to silicon-carbon bonds in the barrier film. In one embodiment, the ratio of carbon-carbon bonds to silicon-carbon bonds in the barrier film of the present invention may be between about 10% to about 15%.

The source for carbon-carbon bonds in the precursor may comprise carbon-carbon bond containing hydrocarbon, carbon-carbon bond containing Si—C compound, or combinations thereof.

Carbon-carbon bonds containing carbon hydride may be any carbon hydrides comprise single, double or triple carbon-carbon bonds, for example ethylene ($C_2H_4$), or propyne ($C_3H_4$).

Carbon-carbon bonds and silicon-carbon bond containing compound may be any silicon carbon compound comprising single, double or triple carbon-carbon bonds.

Exemplary carbon-carbon bonds and silicon-carbon bonds containing compound may be single carbon-carbon bonds containing Si—C compound in the form of:

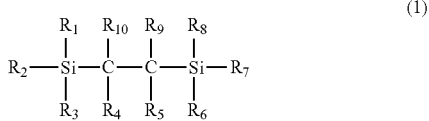

(1)

wherein $R_1$, $R_2$, $R_3$, $R_4$, $R_5$, $R_6$, $R_7$, $R_8$, $R_9$, and $R_{10}$ are each independently one of H, $CH_3$, $C_2H_5$, or any alkyl group.

Exemplary carbon-carbon bonds containing Si—C compound may also be dould carbon-carbon bond (C═C) containing Si—C compound in the form of,

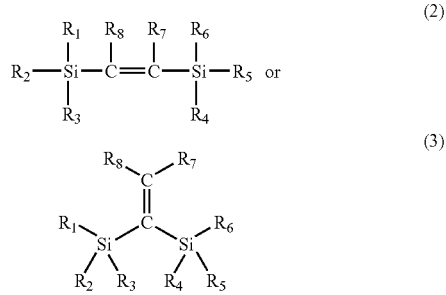

wherein $R_1$, $R_2$, $R_3$, $R_4$, $R_5$, $R_6$, $R_7$, and $R_8$ are each independently H, $CH_3$, or any alkyl group.

In one embodiment, the source for carbon-carbon bonds is also the source for silicon. In another embodiment, the precursor may comprise an additional silicon source, for example trimethyl-silane (TMS), added to the carbon-carbon bond source in the form of (1), (2) or (3).

Suitable silicon source may comprise one or more oxygen-free organosilicon compounds. For example, one or more of the following compounds,

| | |
|---|---|
| Methylsilane, | $CH_3$—$SiH_3$ |
| Dimethylsilane, | $(CH_3)_2$—$SiH_2$ |
| Trimethylsilane (TMS), | $(CH_3)_3$—$SiH$ |
| Ethylsilane, | $CH_3$—$CH_2$—$SiH_3$ |
| Disilanomethane, | $SiH_3$—$CH_2$—$SiH_3$ |
| Bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| 1,3,5-trisilano-2,4,6-trimethylene, | —($SiH_2$—$CH_2$)$_3$— (cyclic) |
| Diethylsilane | $(C_2H_5)_2SiH_2$ |
| Propylsilane | $C_3H_7SiH_3$ |
| Vinylmethylsilane | $(CH_2$=$CH)(CH_3)SiH_2$ |
| 1,1,2,2-tetramethyldisilane | $HSi(CH_3)_2$—$Si(CH_3)_2H$ |
| Hexamethyldisilane | $(CH_3)_3Si$—$Si(CH_3)_3$ |
| 1,1,2,2,3,3-hexamethyltrisilane | $H(CH_3)_2Si$—$Si(CH_3)_2$—$SiH(CH_3)_2$ |
| 1,1,2,3,3-pentamethyltrisilane | $H(CH_3)_2Si$—$SiH(CH_3)$—$SiH(CH_3)_2$ |
| Bis(methylsilano)ethane | $CH_3$—$SiH_2$—$(CH_2)_2$—$SiH_2$—$CH_3$ |
| Bis(methylsilano)propane | $CH_3$—$SiH_2$—$(CH_2)_3$—$SiH_2$—$CH_3$ |
| Bis(dimethylsilano)ethane | $(CH_3)_2$—$SiH$—$(CH_2)_2$—$SiH$—$(CH_3)_2$ |
| Bis(dimethylsilano)propane | $(CH_3)_2$—$SiH$—$(CH_2)_3$—$SiH$—$(CH_3)_2$ | and fluorinated hydrocarbon derivatives thereof.

Additional silicon source may be found in U.S. Pat. No. 6,790,788, entitled "Method of Improving Stability in Low k Barrier Layers", which is herein incorporated by reference.

Figure 3:
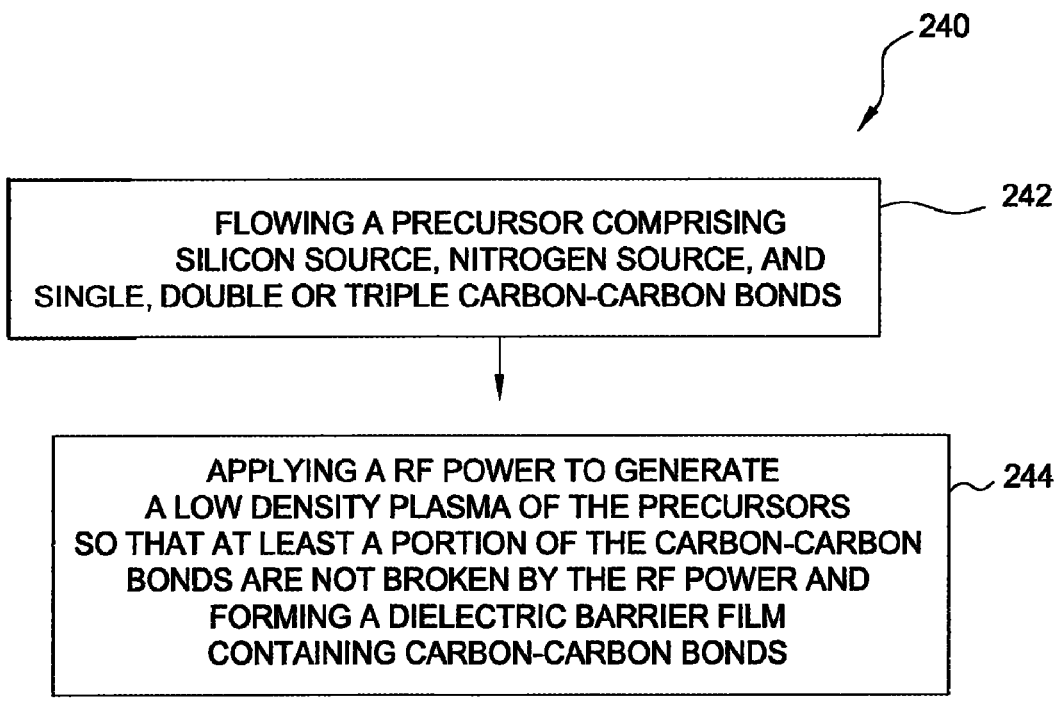
FIG. 3 is a flow chart illustrating a process sequence in accordance with another embodiment of the present invention.

FIG. 3 is a flow chart illustrating a process sequence 240 in accordance with another embodiment of the present invention. The process sequence 240 is similar to the process sequence 200 of FIG. 2, except using a precursor comprising a nitrogen source in addition to source for carbon-carbon bonds and silicon. In one embodiment, the nitrogen source is configured to increase film stability particularly when double and/or triple carbon-carbon bonds are used in the precursor. When C═C and/or C≡C bond containing precursor is used, some C═C and/or C≡C bonds may be incorporated in the barrier film formed on the substrate. The presence of C═C and/or C≡C bonds makes the barrier film susceptible to oxidation and reduces etching resistivity of the barrier film. By introducing a controlled amount of nitrogen, C═C and/or C≡C bonds may be eliminated from the barrier film. Si—N bonds may be generated in the barrier film. It has been observed that controlled nitrogen doping increases stability without increasing dielectric constant.

In step 242, a precursor is flown into a processing chamber, generally after positioning a substrate in the cleaned and purged processing chamber. The precursor comprises a silicon source, a nitrogen source, a source for carbon-carbon bonds including single carbon-carbon bonds (C—C), double carbon-carbon bonds (C═C), triple carbon-carbon bonds (C≡C), or combinations thereof.

In step 244, a RF power is applied and a low density plasma of the precursor is generated in the processing chamber. The RF power is configured to cause low bombardment that enables reaction of species in the precursor and preserves at least a portion of the carbon-carbon bonds. As a result, a carbon-carbon bond containing film is formed on the substrate being processed.

Suitable nitrogen source may be nitrogen containing gas or compound that does not comprise oxygen, for example, nitrogen gas ($N_2$), ammonia ($NH_3$), or combinations thereof.

In one embodiment, oxygen is minimized or eliminated from the precursor used in step 210, and step 242 so that Si—O bonds are minimized or eliminated in the barrier film.

Compared to conventional barrier films, the barrier films of the present invention generally have a lowered dielectric constant, e.g. less than or equal to 4.0, improved etching resistivity, and increased diffusion resistance against copper. The barrier films of the present invention may be used as any conventional barrier layers, such as a dielectric barrier between metal structures and surrounding low k dielectric materials.

In one embodiment, porosity may be generated in the barrier film of the present invention by adjusting the plasma density used to deposit the barrier film. With increased porosity, the barrier film of the present invention remains high etching resistivity due to high carbon content. Additionally, the presence of high carbon concentration in the barrier film makes the barrier film hydrophobic. In one embodiment, the barrier film of the present invention may be made porous and used as a membrane in etching materials underneath the barrier film using wet etching solution.

EXAMPLES

The following examples demonstrate deposition of a barrier film in accordance with one embodiment of the present invention.

Example 1

A PECVD deposition process for depositing a porous dielectric layer comprising silicon carbide using a precursor comprising the combination of trimethylsilane (TMS, $(CH_3)_3SiH$) and ethylene ($C_2H_4$). A carrier gas, such as helium, argon, nitrogen, or combinations thereof, is introduced with the precursor to the processing chamber.

The ratio of TMS and ethylene is set such that the atomic percentage of carbon of the mixture is greater than 15%. In one embodiment, the ratio of ethylene and TMS is between about 0.5:1 to about 8:1. In another embodiment, the ratio of ethylene and TMS is between about 1:1 to about 4:1. The processing parameters are as follows:

Flow rate (including precursor and carrier gas): between about 5 sccm to about 10,000 sccm, wherein the flow rate of carrier gas may be between about 5 sccm to about 10,000 sccm.

Spacing: from about 200 mils to about 2000 mils;

Temperature: between about 100° C. to about 550° C., or between about 200° C. to about 350° C.;

Chamber pressure: between about 10 mTorr to one atmosphere;

RF power: from about 15 W to about 3,000 W. In one embodiment, the RF power may be below about 500 W.

Example 2

A PECVD deposition process for depositing a porous dielectric layer comprising silicon carbide using a precursor comprising the combination of trimethylsilane (TMS, $(CH_3)_3SiH$), ethylene ($C_2H_4$) and ammonia ($NH_3$). In one embodiment, the ratio of ethylene and TMS is between about 3:1 to about 5:1. The ratio of ammonia and TMS may be between about 1:10 to about 10:1. In another embodiment, the ratio of ammonia and TMS may be between about 1:4 to about 3:1. The processing parameters are as follows:

Flow rate (including precursor and carrier gas): between about 5 sccm to about 10,000 sccm, wherein the flow rate of carrier gas may be between about 5 sccm to about 10,000 sccm.

Spacing: from about 200 mils to about 2000 mils;

Temperature: between about 100° C. to about 550° C., or between about 200° C. to about 350° C.;

Chamber pressure: between about 10 mTorr to one atmosphere;

RF power: from about 15 W to about 3,000 W. In one embodiment, the RF power may be below about 500 W.

Example 3

A PECVD deposition process for depositing a porous dielectric barrier using a precursor comprising the combination of trimethylsilane (TMS, $(CH_3)_3SiH$) and ethylene ($C_2H_4$). The process conditions, including the ratio of TMS and ethylene, are set such that the atomic percentage of carbon is greater than 15%. In one embodiment, the ratio of ethylene and TMS is about 1:1 to about 8:1, the flow rate of the TMS/ethylene precursor and carrier gas is between about 5 sccm to about 10,000 sccm, and the temperature is about 350° C. For these conditions, the chamber pressure is between about 10 mTorr to about one atmosphere, the radio frequency (RF) power for plasma generation is between about 15 W to about 3,000 W, and the spacing between a substrate and a shower head, configured for providing precursors to the substrate being processed, is from about 200 mils to about 2000 mils.

Advantages of the Barrier

The dielectric barrier film of the present invention has several advantages over conventional barrier film, for example, high etching resistance, low dielectric constant, low ultra violent absorption, high diffusion barrier, and hydrophobic. The advantages of the film not only make it a better barrier when used as a traditional barrier film, but also enable novel applications.

Figure 4A:
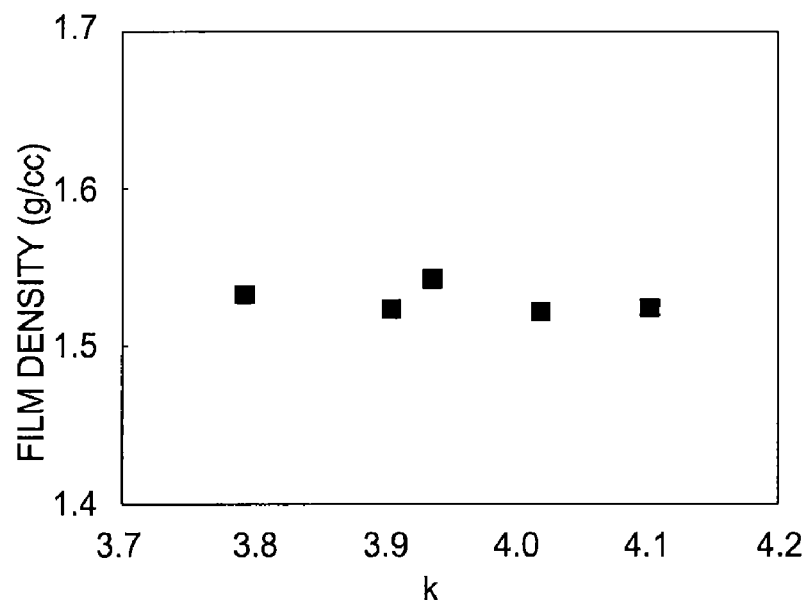
FIG. 4A is a chart showing dielectric constant of a dielectric barrier formed using an exemplary recipe in accordance with one embodiment of the present invention.

FIG. 4A is a chart showing dielectric constant of dielectric barriers formed using recipes similar to Example 1. As shown in FIG. 4A, when ratio of ethylene and TMS increase (C═C concentration increases), film density remains substantially the same and the dielectric constant decreases. Therefore, a film with lower dielectric constant may be achieved by increasing concentration of carbon-carbon bonds in the precursor.

Figure 4B:
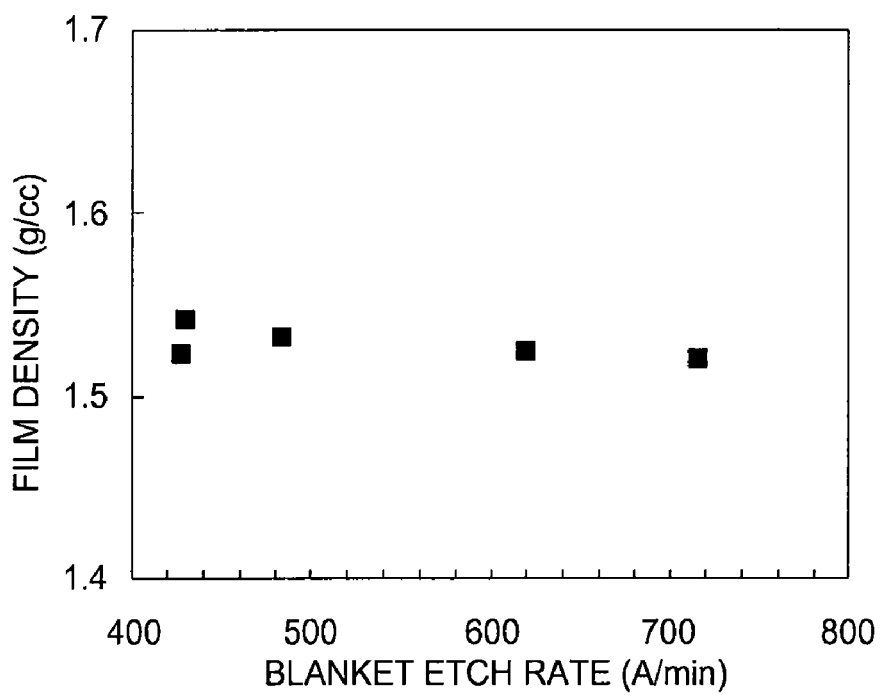
FIG. 4B is a chart showing etching resistivity of the dielectric barrier formed using the exemplary recipe in accordance with one embodiment of the present invention.

FIG. 4B is a chart showing etching resistivity of the dielectric barrier formed using recipes similar to Example 1. As shown in FIG. 4B, when ratio of ethylene and TMS increase (C═C concentration increases), film density remains substantially the same and etching resistivity increases. Therefore, a film with stronger etching resistivity may be achieved by increasing concentration of carbon-carbon bonds in the precursor.

Figure 4C:
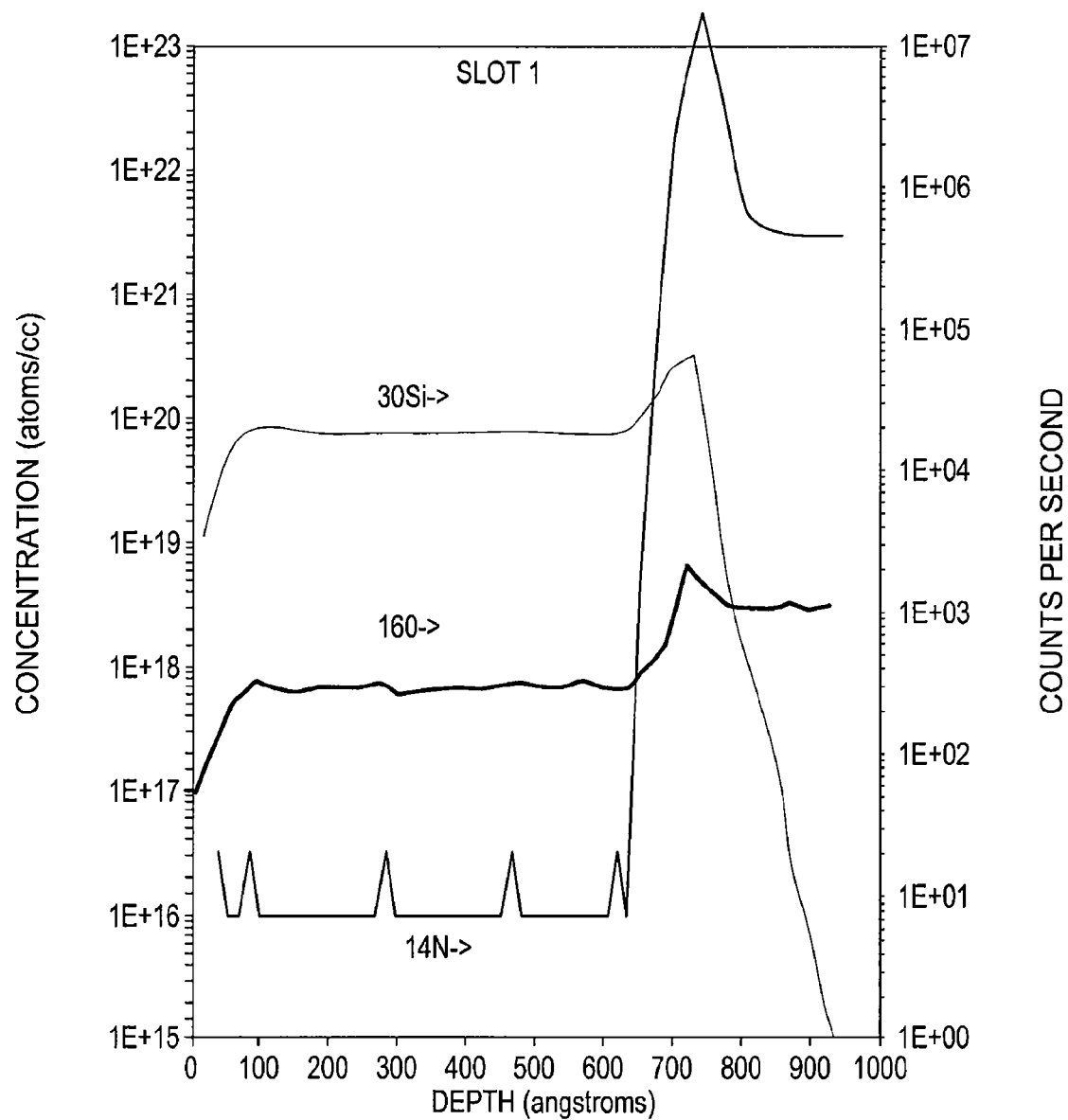
FIG. 4C is a chart showing copper diffusion barrier property of the dielectric barrier formed using the exemplary recipe in accordance with one embodiment of the present invention.

FIG. 4C is a chart showing copper diffusion barrier property of a dielectric barrier formed using recipes similar to Example 2. FIG. 4C shows a diffusion profile of copper in the dielectric film, comprising silicon carbide nitride (SiCN), in accordance with embodiment of the present invention. For copper, diffusion barrier depth is generally defined as the distance within which copper concentration decreases by four orders of magnitude. As shown in FIG. 4C, copper diffusion depth for the barrier film is about 100 Å.

The dielectric barrier film of the present invention also has low absorption ratio for ultra violet (UV) energy, therefore, resulting in less stress when exposed to UV compared to conventional barrier films, such as conventional SiCN films. Even though, formation of the dielectric barrier film does not require UV curing, the dielectric barrier film is likely to be exposed to UV energy in subsequent processes, for example curing of a subsequent interlayer dielectric. Low UV adsorption results in less structure changes, therefore, less stress in a substrate.

Application of the Barrier

Figure 5:
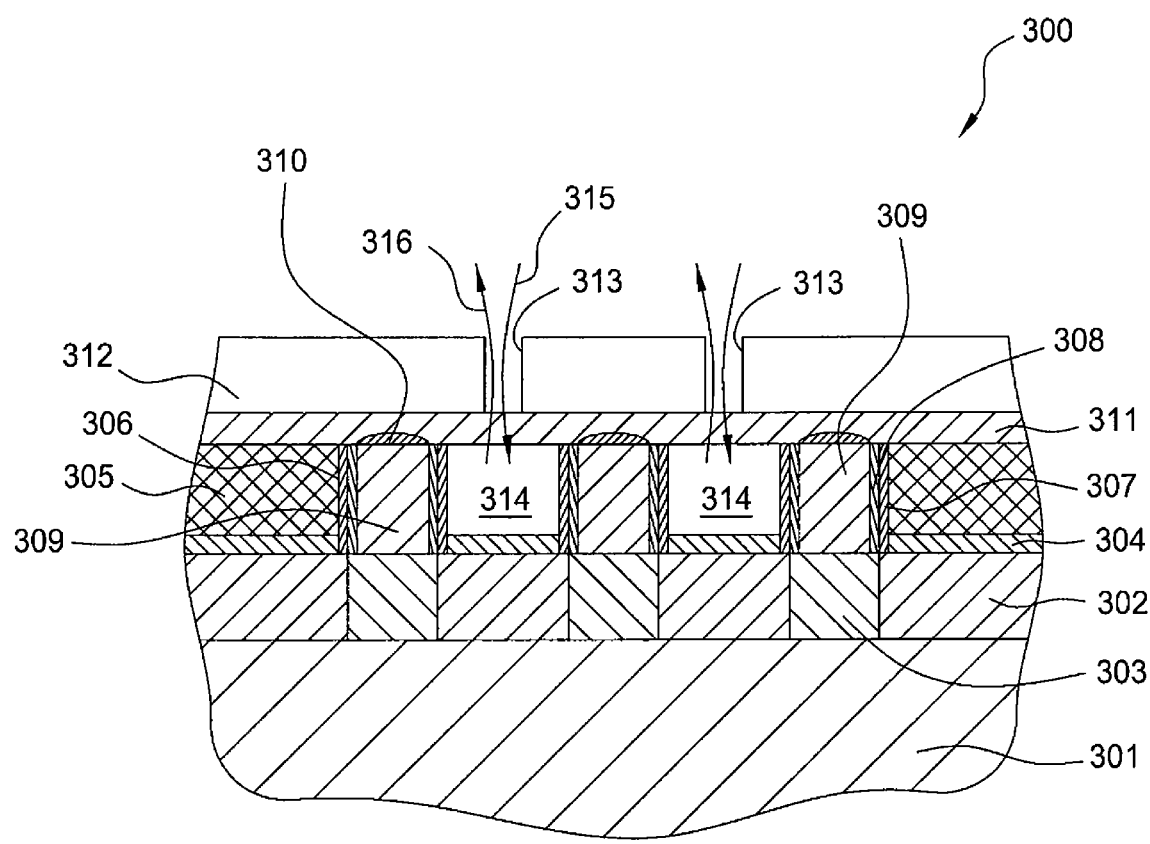
FIG. 5 schematically illustrates a substrate stack including air gaps formed through a dielectric barrier in accordance with one embodiment of the present invention.

As discussed above, the barrier film of the present invention film not only makes an improved barrier when used as a traditional barrier film, and also enables novel applications. FIG. 5 schematically illustrates a substrate stack 300 including air gaps formed through a dielectric barrier in accordance with one embodiment of the present invention.

The substrate stack 300 comprises a substrate 301 wherein devices, such as transistors, are formed. A contact layer 302 may be formed on the substrate 301 after the devices are formed therein. The contact layer 302 is typically a dielectric layer having conductive elements 303 formed therein. The conductive elements 303 are configured to electrically communicate with the devices formed in the substrate 301. Multilevel interconnect structures, typically including alternate trench layers and via layers of conductive materials and dielectrics, are formed on the contact layer 302 to provide circuitry for the devices in the substrate 301. A trench layer generally refers to a dielectric layer having conductive lines formed therein. A via layer is a layer of dielectrics having small metal vias that provide electrical pathways from one trench layer to another trench layer.

As shown in FIG. 5, an etch stop layer 304 is deposited all over the contact layer 302, and a first dielectric layer 305, for example, a silicon dioxide layer, is deposited on the etch stop layer 304. The etch stop layer 304 is configured to protect the contact layer 304 during a subsequent etching step. The etch stop layer 304 may be a silicon carbide layer.

Trenches 306 are formed in the first dielectric layer 305 and the etch stop layer 304 using any conventional method known to those skilled in the art, such as patterning using photoresist, followed by etching.

A conformal dielectric barrier film 307 is then deposited over the entire top surface of the substrate including sidewalls of the trenches 306. The conformal dielectric barrier film 307 is configured to serve as a barrier layer to protect metal structures, such as copper lines, subsequently formed in the trenches 306 from wet etching chemistry during subsequent process. Additionally, the conformal dielectric film 307 also provides mechanical support to the metal structures formed in the trenches 306 after air gaps are formed therearound. In one embodiment, the conformal dielectric barrier film 307 comprises a dielectric material, for example boron nitride (BN), silicon nitride (SiN), silicon carbide (SiC), silicon carbine nitride (SiCN), silicon boron nitride (SiBN), or the combinations thereof.

The conformal dielectric barrier film 307 is a boron nitride (BN) layer, with a k value less than about 5.0, formed by a plasma enhance chemical vapor deposition (PECVD) process. The conformal dielectric barrier film 307 may have a thickness from about 10 Å to about 200 Å. Depositing the boron nitride layer may comprise forming a boron-containing film from a boron-containing precursor, and treating the boron-containing film with a nitrogen-containing precursor. Forming the boron-containing film may be performed with or without a presence of plasma. The boron-containing precursor may be diborane ($B_2H_6$), borazine ($B_3N_3H_6$), or an alkyl-substituted derivative of borazine. Treating the boron-containing film may be selected from the group consisting of a plasma process, an ultraviolet (UV) cure process, a thermal anneal process, and combinations thereof. The nitrogen-containing precursor may be nitrogen gas ($N_2$), ammonia ($NH_3$), or hydrazine ($N_2H_4$).

A metallic barrier layer 308 is formed above the conformal dielectric barrier film 307. The metallic barrier layer 308 is configured to prevent diffusion between metal lines subsequently deposited in the trenches 306 and the structures nearby. The metallic barrier layer 308 may comprise tantalum (Ta) and/or tantalum nitride (TaN).

The trenches 306 are then filled with conductive lines 309 comprising one or more conductive materials, for example copper. A dry etching step may be performed to remove the metallic barrier layer 308 and the conformal dielectric barrier film 307 from entire or portions of bottom walls of the trenches 306, so that the conductive lines 309 may be in direct contact with the conductive elements 303 in the contact layer 302. Depositing the conductive lines 309 may comprise forming a conductive seed layer and depositing a metal on the conductive seed layer. The conductive lines 309 may comprise copper (Cu), aluminum (Al), or any suitable material with desirable electrical conductivity.

A chemical mechanical polishing (CMP) process is performed on the conductive lines 309, the metallic barrier layer 308, and the conformal dielectric barrier film 307 so that the dielectric layer 305 is exposed.

A self aligned capping layer 310 is formed on the conductive lines 309. The self-aligned capping layer 310 is configured to be a barrier to prevent diffusion of species across an upper surface of the conductive lines 309. For the conductive lines 309 comprise copper, the self-aligned capping layer 310 may comprise cobalt (Co), tungsten (W), or phosphorus (P). The self-aligned capping layer 310 may prevent diffusion of both copper and oxygen. The self-aligned capping layer 310 may be formed using electroless deposition.

A porous dielectric barrier layer 311 is deposited on the conductive lines 309 and the conformal dielectric barrier film 307. The porous dielectric barrier layer 311 may be a low k dielectric with k<4.0. The porous dielectric barrier layer 311 may be deposited using methods in accordance with embodiment of the present invention. In one embodiment, a low wet etching rate may be achieved by reducing or eliminating Si—O bond in the porous dielectric barrier layer 311. The porous dielectric barrier layer 311 may comprises silicon carbide (SiC), silicon carbide nitride (SiCN), or combinations thereof, without silicon-carbon bonds (Si—O). In one embodiment, the porous dielectric barrier layer 311 may have a thickness of between about 10 Å to about 500 Å.

The porous dielectric barrier layer 311 is permeable allowing etching solution, such as diluted hydrogen fluoride (DHF) solution, to infiltrate into a removable layer, such as the first dielectric layer 305, underneath to form air gaps. The porous dielectric barrier layer 311 generally has a low wet etching rate such that contacting with etching solution does not affect its structure. In one embodiment, the porous dielectric barrier layer 311 also serves as a diffusion barrier layer for metals, such as copper, in the conductive lines 309. In one embodiment, the porous dielectric barrier layer 311 is hydrophobic, therefore, minimizing residues and contamination from wet etching process. In one embodiment, hydrophobicity of the porous dielectric barrier layer 311 may be acquired by controlling carbon content in the porous dielectric barrier layer 311.

A pattern may be generated to expose areas wherein air gaps are to be formed. A photoresist layer 312 may be deposited on the porous dielectric barrier layer 311. A pattern may then be developed in the photoresist layer 312 exposing portions of the porous dielectric layer 311 via holes 313. The pattern is used to limit air gaps in areas where distance between the conductive lines 309 is in certain range. Air gaps are most effective to lower k value of dielectrics between closely packed conductive lines 309. When the distance between the conductive lines 309 are relatively large, it is not necessary to lower the k value using air gaps since the capacitive coupling between adjacent conductive lines 309 is small due to the large spacing. Additionally, forming an air gap between far away metal structures, such as the conductive lines 309 with large pitch, or vias in a via layer, may effect integrity of the mechanical structure. Therefore, the pattern is formed in this step to limit air gaps in certain range. In one embodiment, air gaps may be formed between neighboring conductive lines 309 where the distance between the conductive lines 309 is between about 5 nm to about 200 nm.

A wet etching process is performed to form air gaps. Portions of the first dielectric layer 305 contact an etching solution, such as DHF solution, through the porous dielectric barrier layer 311 exposed by the holes 313, and are completely or partially etched away forming air gaps 314. In one embodiment, the DHF solution comprises 6 parts of water and 1 part of hydrogen fluoride. Other wet etching chemicals, such as buffered hydrogen fluoride (BHF, $NH_4F+HF+H_2O$), may also be used to etch the first dielectric layer 305 via the porous dielectric barrier layer 311. The etching solution reaches the first dielectric layer 305 through the porous dielectric barrier layer 311 and the etching products is removed through the porous dielectric barrier layer 311, as shown in arrows 315 and 316.

After the formation of the air gaps 314, a cleaning process may be performed to remove the photoresist layer 312 and any residues. Interlayer dielectrics may be deposited over the porous dielectric barrier layer 311 preparing for the next metal layer.

The porous dielectric barrier film of the present invention is permeable to wet etching chemicals and is used as membrane to allow the wet etching solution to infiltrate into removable dielectric layer underneath to form an air gap. For the purpose of air gap formation, the porous dielectric barrier film of the present invention overcomes several disadvantages of conventional air gap formation methods, such as thermal decomposition. Particularly, wet etch chemicals such as DHF and BHF, are used to remove formed dielectrics such as $SiO_2$ to form an air gap. All the disposable materials will be removed and any remaining disposable materials in the structure may cause reliability issue in the subsequent process steps. The wet etching method used in the present invention may be selective and apply only to selected area via photolithography and patterning steps. Therefore, area percentage and location of air gap can be designed to meet desired dielectric value as well as necessary mechanical strength. For example, air gaps may be formed in the dense metal areas where pitch length between the two adjacent metal lines is between 10 nm and 200 nm.

Detailed description of air gap formation using a porous dielectric film may be found in U.S. patent application Ser. No. 11/869,409, filed Oct. 9, 2007, published as US 2009/0093100, entitled "Method for Forming an Air Gap in Multilevel Interconnect Structure", which is herein incorporated by reference.

While the foregoing is directed to embodiments of the present invention, other and further embodiments of the invention may be devised without departing from the basic scope thereof, and the scope thereof is determined by the claims that follow.

What is claimed is:

1. A method for processing a semiconductor substrate, comprising:
   flowing a precursor to a processing chamber, wherein the precursor comprises a mixture of an organosilicon compound and a hydrocarbon compound, the organosilicon compound comprises silicon-carbon bonds and carbon-carbon bonds, and the hydrocarbon compound comprises carbon-carbon bonds, and wherein the precursor comprises a double carbon-carbon bond (C=C) source or a triple carbon-carbon bond (C≡C) source;
   generating a low density plasma of the precursor in the processing chamber to form a dielectric barrier film having carbon-carbon bonds on the semiconductor substrate, wherein at least a portion of the carbon-carbon bonds in the precursor is preserved in the low density plasma and incorporated in the dielectric barrier film, and the dielectric barrier film does not contain Si—O bonds; and
   introducing a controlled amount of a nitrogen source to eliminate double carbon-carbon (C=C) bonds or triple carbon-carbon (C≡C) bonds from the dielectric barrier film.

2. A method for processing a semiconductor substrate, comprising:
   flowing a precursor to a processing chamber, wherein the precursor comprises a mixture of an organosilicon compound, trimethylsilane, and ethylene ($C_2H_4$), the organosilicon compound comprises silicon-carbon bonds and carbon-carbon bonds, and wherein a ratio of trimethylsilane and ethylene is set that an atomic percentage of carbon in the precursor is greater than 15%; and
   generating a low density plasma of the precursor in the processing chamber to form a dielectric barrier film having carbon-carbon bonds on the semiconductor substrate, wherein at least a portion of the carbon-carbon bonds in the precursor is preserved in the low density plasma and incorporated in the dielectric barrier film, and the dielectric barrier film does not contain Si—O bonds.

3. A method for processing a semiconductor substrate, comprising:
   flowing a precursor to a processing chamber, wherein the precursor comprises a mixture of an organosilicon compound, trimethylsilane, and ethylene ($C_2H_4$), the organosilicon compound comprises silicon-carbon bonds and carbon-carbon bonds, and wherein the precursor further comprises ammonia ($NH_3$), a ratio of ethylene and trimethylsilane is between 3:1 and 5:1, and a ratio of ammonia and trimethylsilane is between about 1:10 to about 10:1; and
   generating a low density plasma of the precursor in the processing chamber to form a dielectric barrier film having carbon-carbon bonds on the semiconductor substrate, wherein at least a portion of the carbon-carbon bonds in the precursor is preserved in the low density plasma and incorporated in the dielectric barrier film, and the dielectric barrier film does not contain Si—O bonds.

* * * * *